(12) United States Patent
Dhindsa et al.

(10) Patent No.: US 7,276,135 B2
(45) Date of Patent: Oct. 2, 2007

(54) VACUUM PLASMA PROCESSOR INCLUDING CONTROL IN RESPONSE TO DC BIAS VOLTAGE

(75) Inventors: Rajinder Dhindsa, San Jose, CA (US); Felix Kozakevich, Sunnyvale, CA (US); Dave Trussell, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 331 days.

(21) Appl. No.: 10/855,707

(22) Filed: May 28, 2004

(65) Prior Publication Data

US 2005/0264219 A1 Dec. 1, 2005

(51) Int. Cl.
*C23F 1/00* (2006.01)

(52) U.S. Cl. ............... 156/345.28; 156/345.41; 156/345.48; 438/5; 438/10; 118/723 E; 315/111.21

(58) Field of Classification Search ........... 315/111.21, 315/111.31, 111.51, 111.71; 118/723 R, 118/723 E, 723 I; 438/10, 17, 729, 5, 710, 438/711; 219/121.51–121.55, 121.31–121.34, 219/121.36, 121.43; 156/345.28, 345.41, 156/345.44, 345.45, 345.48
See application file for complete search history.

(56) References Cited

U.S. PATENT DOCUMENTS

| | | | |
|---|---|---|---|
| 5,401,356 A * | 3/1995 | Enami et al. ................ 438/5 |
| 6,174,450 B1 | 1/2001 | Patrick et al. | |
| 6,303,044 B1 * | 10/2001 | Koemtzopoulos et al. .... 216/59 |
| 6,367,413 B1 | 4/2002 | Sill et al. | |
| 6,528,949 B2 * | 3/2003 | Hao ...................... 315/111.71 |
| 6,677,711 B2 * | 1/2004 | MacGearailt .......... 315/111.21 |
| 6,741,446 B2 * | 5/2004 | Ennis .................... 361/234 |
| 6,922,324 B1 * | 7/2005 | Horwitz .................. 361/234 |
| 2002/0139477 A1 * | 10/2002 | Ni et al. ................ 156/345.44 |
| 2004/0040931 A1 * | 3/2004 | Koshiishi et al. ........... 216/67 |
| 2005/0264218 A1 * | 12/2005 | Dhindsa et al. ........ 315/111.21 |

* cited by examiner

Primary Examiner—Haissa Philogene
(74) Attorney, Agent, or Firm—Lowe Hauptman & Berner LLP (57) ABSTRACT

A plasma processor chamber includes a bottom electrode and a top electrode assembly having a center electrode surrounded by a grounded electrode. RF excited plasma between the electrodes induces a DC bias on them. A measure of the bottom electrode DC bias controls the capacitance of a first series resonant circuit connected between the center electrode and ground. A measure of the center electrode DC bias controls the capacitance of a second series resonant circuit connected between the bottom electrode and ground.

63 Claims, 5 Drawing Sheets

VACUUM PLASMA PROCESSOR INCLUDING CONTROL IN RESPONSE TO DC BIAS VOLTAGE

RELATION TO COPENDING APPLICATION

The present application is related to the copending, commonly assigned Dhindsa et al. application, filed simultaneously with the present application, and entitled PLASMA PROCESSOR WITH ELECTRODE RESPONSIVE TO SEVERAL FREQUENCIES.

FIELD OF INVENTION

The present invention relates generally to vacuum plasma processors and more particularly to a vacuum plasma processor including control in response to a DC bias voltage.

BACKGROUND ART

It is known to apply AC plasma excitation fields to a region of a vacuum chamber for plasma processing a workpiece, wherein the region is coupled to a gas that the fields convert into the processing plasma. The workpiece is usually a semiconductor wafer, or dielectric plate and the plasma is involved in forming integrated circuit features on the workpiece. The excited plasma typically dry etches the workpiece, but in some instances results in materials being deposited on the workpiece. Typically, the AC plasma excitation fields are supplied to the region by a pair of spaced electrodes in the chamber or one electrode in the chamber and a coil, located outside the chamber. (It is to be understood that the term "reactance" when used in the present document in connection with a vacuum plasma processing chamber refers to an electrode or a coil for supplying AC plasma excitation fields to a plasma in the chamber.)

As the size of the features continues to decrease, there are increased requirements for precise control of various parameters of the plasma processing a workpiece. These parameters include characteristics of the AC fields that the reactance couples to the plasma. In particular, the intensity and shape of the AC fields that the reactance couples to the plasma have a substantial effect on the nature of the workpiece features.

SUMMARY OF THE INVENTION

An aspect of the present invention concerns a vacuum plasma processor comprising a vacuum plasma chamber for processing a workpiece. The chamber includes a first electrode assembly arranged to be electrically coupled with gas in the chamber and a second electrode assembly arranged to be electrically coupled with gas in the chamber. The first electrode assembly includes a first electrode, while the second electrode assembly includes a second electrode. An AC electric source arrangement having sufficient power to excite the gas in the chamber to a plasma and including plural frequencies is connected to at least one of said electrodes. The chamber and the electrode assemblies are arranged for causing (a) plasma exciting AC electric field lines at frequencies of the source arrangement to subsist between the first and second electrode assemblies and (b) a DC bias voltage to be developed on the electrodes in response to the gas in the chamber being excited to a plasma. Circuitry affects the AC electric field lines based on an indication of the detected DC bias voltages.

Preferably, the AC source arrangement and the first and second electrodes are arranged for causing first and second frequencies to be respectively coupled from the source arrangement to the first and second electrodes so that electric field lines at the first frequency extend between the first and second electrodes and electric field lines at the second frequency extend between the second and first electrodes. The circuitry includes a first circuit connected between the first electrode and a reference potential and a second circuit connected between the second electrode and the reference potential. The first circuit includes a first variable impedance for affecting the electric field lines at the second frequency based on the indication of the detected DC bias voltage of the second electrode, while the second circuit includes a second variable impedance for affecting the electric field lines at the first frequency based on the indication of the detected DC bias voltage of the first electrode.

The second assembly also preferably includes a third electrode. The chamber and the electrode assemblies are arranged for causing (a) first electric field lines at a first of the AC frequencies to subsist between the first electrode and at least one of the second and third electrodes and (b) second electric field lines at a second of the AC frequencies to subsist between the second and third electrodes. The chamber, the electrode assemblies and the circuitry are arranged for causing the circuitry to affect the first and second electric field lines based on indications of the detected DC bias voltages.

The first assembly also preferably includes a fourth electrode. The chamber and the electrode assemblies are arranged for causing third electric field lines at the first AC frequency to subsist between the first and fourth electrodes. The chamber, the electrode assemblies and the circuitry are arranged for causing the circuitry to affect the third electric field lines based on an indication of the second detected DC bias voltage.

An added aspect of the invention relates to a vacuum plasma processor comprising a vacuum plasma chamber for processing a workpiece. The chamber includes a first electrode assembly arranged to be electrically coupled with gas in the chamber and a second electrode assembly arranged to be electrically coupled with gas in the chamber. The first electrode assembly includes a first electrode, while the second electrode assembly includes second and third electrodes spaced from each other. An AC electric source arrangement connected to at least one of said electrodes has sufficient power to excite the gas in the chamber to a plasma. The chamber and the electrode assemblies are arranged for causing (a) plasma exciting AC electric fields at a frequency of the source arrangement to subsist between the first and second electrode assemblies and (b) a DC bias voltage to be developed on at least one of said electrodes in response to the gas in the chamber being excited to a plasma. Circuitry is arranged for controlling the plasma exciting AC electric fields in response to an indication of the DC bias voltage. The circuitry can be manually controlled in response to the indication of the DC bias voltage or the circuitry can be automatically controlled in response to an output signal of the detector.

The chamber and the electrode assemblies are preferably arranged for causing (a) first electric field lines at said AC frequency to subsist between the first electrode and at least one of the second and third electrodes and (b) second electric field lines at said AC frequency to subsist between the second and third electrodes. The chamber, the electrode assemblies and the circuitry are arranged for causing the circuitry to affect the first and/or second electric field lines in response to the indication of the DC bias voltage.

The first assembly also preferably includes a fourth electrode at least substantially surrounding the first electrode. The fourth electrode is coaxial with the first, second and third electrodes and each has a circular periphery. The first and fourth electrodes are substantially coplanar. The chamber and electrode assemblies are arranged for causing third electric field lines at the AC frequency to subsist between the first and fourth electrodes. The chamber, electrode assemblies and the circuitry are arranged for causing the circuitry to affect the third electric field lines in response to the DC bias voltage indication.

The circuitry preferably includes a variable impedance connected to one of the electrodes. The variable impedance is arranged to have a value controlled in response to the DC bias voltage indication. Preferably, the variable impedance is connected between the second electrode and a reference potential and is a first reactance of a first series tuned circuit included in a first branch consisting of passive components and/or connected between the first electrode and the reference potential and is a second reactance of a second series tuned circuit included in a second branch consisting of passive components.

Another aspect of the invention relates to a method of processing a workpiece in a vacuum plasma processor chamber including a first electrode assembly that couples AC electric energy to gas in the chamber and a second electrode assembly electrically coupled to gas in the chamber. The first electrode assembly includes a first electrode, while the second electrode assembly includes second and third electrodes spaced from each other. The method comprises exciting the gas in the chamber to a plasma by supplying AC electric energy with sufficient power to at least one of said electrodes. The AC energy supplied to the gas via said at least one of said electrodes causes (a) plasma exciting AC electric fields at a frequency of the supplied AC electric energy to subsist between the first and second electrode assemblies and (b) a DC bias voltage to be developed on at least one of said electrodes in response to the gas in the chamber being excited to a plasma. The plasma exciting AC electric fields are controlled in response to an indication of the DC bias voltage.

Preferably, (a) first electric field lines at the AC frequency subsist between the first electrode and at least one of the second and third electrodes and (b) second electric field lines at said AC frequency subsist between the second and third electrodes. The first and/or second electric field lines are affected based on the indication of the DC bias voltage.

The first assembly preferably includes a fourth electrode and third electric field lines at the frequency subsist between the first and fourth electrodes. The third electric field lines are affected based on the indication of the DC bias voltage.

A further aspect of the invention relates to a vacuum plasma processor comprising a vacuum plasma chamber for processing a workpiece. The chamber is associated with a reactance for electrical coupling with gas in the chamber. The chamber includes an electrode assembly having a first electrode arranged for electrical coupling with gas in the chamber. An AC electric source arrangement connected to the reactance has sufficient power to excite the gas in the chamber to a plasma. The chamber, the reactance and the electrode assembly are arranged for causing (a) plasma exciting AC electric fields at a frequency of the source arrangement to subsist between the reactance and electrode assembly and (b) a DC bias voltage to be developed on an electrode of the electrode assembly in response to the gas in the chamber being excited to a plasma. Circuitry for controlling the plasma exciting AC electric fields includes a variable impedance connected to an electrode of the electrode assembly. The variable impedance has a value that is controlled as a result of an indication of the DC bias voltage. The variable impedance can be manually controlled in response to the indication of the DC bias voltage or the variable impedance can be automatically controlled in response to an output signal of the detector.

An additional aspect of the invention concerns a vacuum plasma processor including a chamber associated with a reactance that couples AC electric energy to gas in the chamber and includes an electrode. Circuitry is connected between the electrode and a reference potential. The method comprises exciting the gas in the chamber to a plasma by supplying AC electric energy with sufficient power to the reactance. The AC energy supplied to the gas via said reactance causes (a) plasma exciting AC electric fields at a frequency of the supplied AC electric energy to subsist between the reactance and the electrode, and (b) a DC bias voltage to be developed on said electrode in response to the gas in the chamber being excited to a plasma. An impedance of the circuitry is varied in response to an indication of the DC bias voltage.

We are aware of MacGearailt, U.S. Pat. No. 6,677,711, commonly assigned with the present application. The MacGearailt patent discloses a vacuum plasma processor including a chamber with a pair of electrodes, one of which carries a workpiece. One of the electrodes is connected to ground by a circuit consisting of passive components. The other electrode is connected to an RF source for exciting gas in the chamber to a plasma. The passive circuit includes a variable impedance having a value responsive to a voltage probe that derives first and second signals respectively replicas of the RF voltage between the electrode and the ground and the RF current flowing in the connection between the electrode and ground. The variable RF impedance is adjusted in response to a function of the RF current and voltage detected by the probe to maintain a constant finite, non-zero RF voltage between the electrode and ground.

The variable impedance includes four separate branches, respectively including switch contacts for connecting the electrode directly to ground, a variable inductor, a variable capacitor, and a variable resistor. The variable inductor, variable capacitor and variable resistor have values controlled in response to signals indicative of the RF voltage and current flowing between the electrode and ground, as derived by the probe. The variable inductor, variable capacitor and variable resistor can be connected in parallel pairs or all three of the impedance elements can be connected in parallel between the electrode and the ground.

Initially the switch is set so the variable impedance is short-circuited. A memory stores a desired set point value for an RF parameter associated with the connection between the electrode and ground. A processor responds to the RF voltage and current replicas that the probe derives when the variable impedance is a short circuit as a result of the switch of the variable impedance being closed. The processor calculates the initial complex voltage between the electrode and the ground, based on the magnitude of the voltage replica and the phase angle between the voltage and current replicas that the probe derives while the variable impedance is short circuited. The processor determines from the initial voltage and current whether the initial phase angle is zero or whether the voltage between the electrode and ground is leading the current or the current is leading the voltage. After the processor makes the phase angle determination, the processor removes the short circuit of the variable impedance by opening the switch. The processor controls the connections and values of the variable inductor, variable capacitor and/or variable resistor to enable the desired RF voltage between the electrode and ground to be achieved, or to enable the desired current flowing from the electrode to ground to be achieved.

Applicants believe that detecting the DC bias voltage of the electrode, rather than the RF voltage and current associated with the electrode, provides improved control over the electric fields of a vacuum plasma processor including a pair of electrodes. Improved electric field control provides improved control over features of a workpiece being processed.

The above and still further objects, features and advantages of the present invention will become apparent upon consideration of the following detailed description of the specific embodiment thereof, especially when taken in conjunction with the accompanying drawings.

DETAILED DESCRIPTION OF THE DRAWING

Figures 1, 1A:
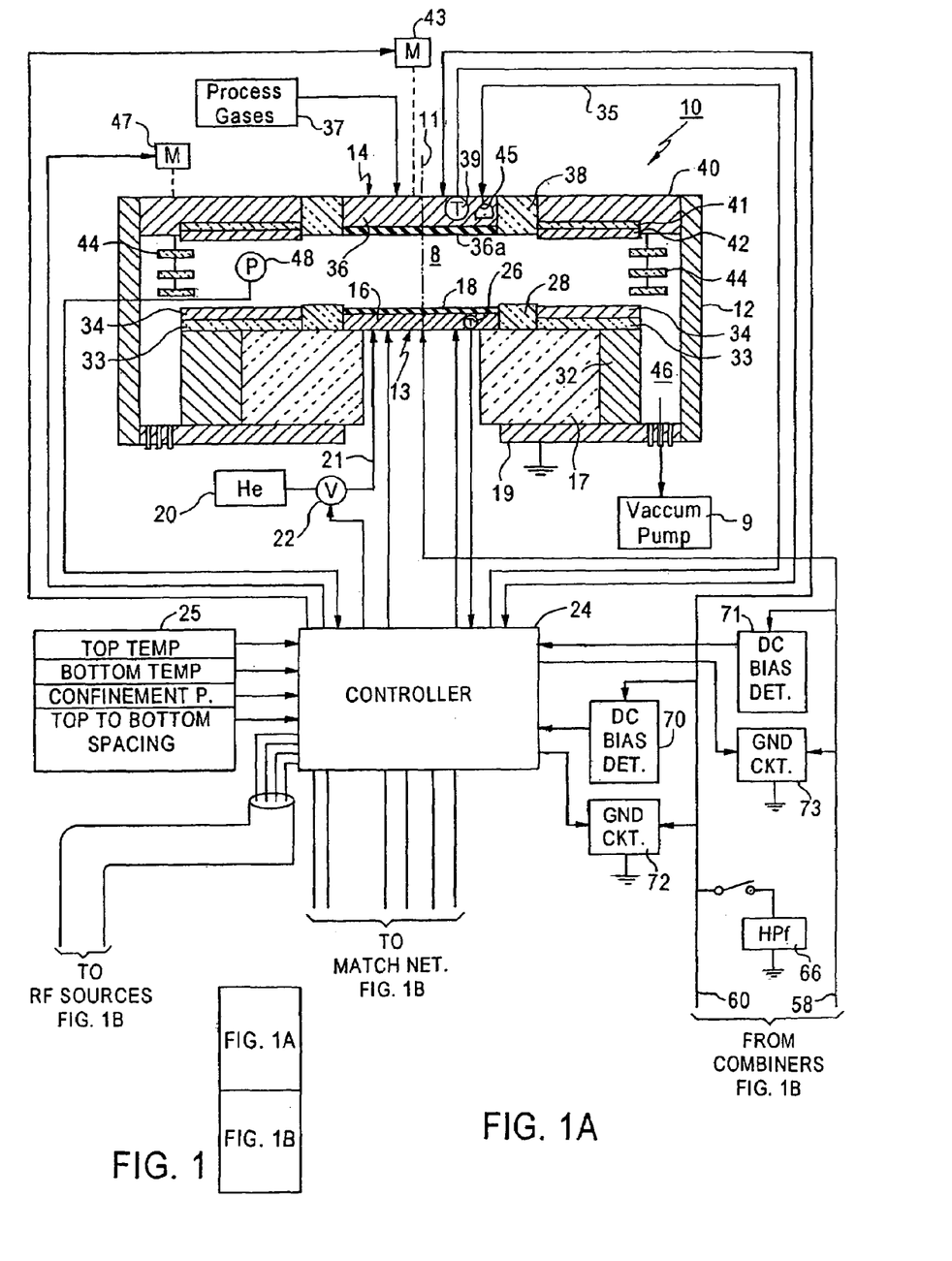
FIG. 1 is a partial block and partial electrical schematic diagram of a preferred embodiment of a vacuum plasma processor including a preferred embodiment of the present invention.
Figure 1B:
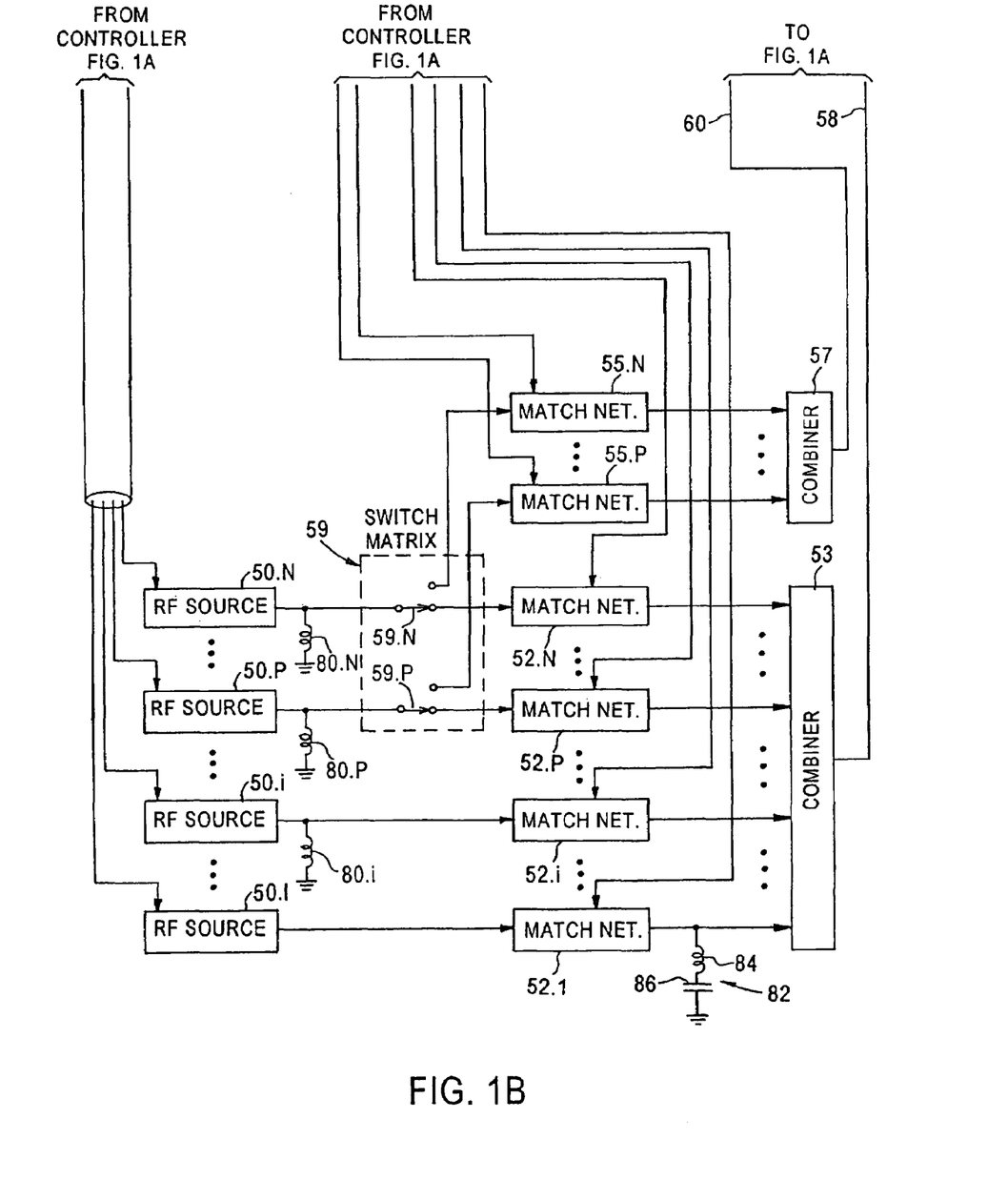

Reference is now made to FIG. 1 of the drawing wherein plasma processor vacuum chamber 10, having longitudinal axis (i.e., centerline) 11 is illustrated as including electrically conductive metal wall 12, bottom electrode assembly 13 and top electrode assembly 14. Wall 12 has a circular inner periphery, coaxial with axis 11. Wall 12 is grounded, i.e., at DC and RF reference potentials. Vacuum pump 9 maintains the interior of chamber 10 at a vacuum on the order of 0.001 to 500 torr during processing. The interior of chamber 10 includes confined plasma region 8 between a bottom boundary close to the top face of bottom electrode assembly 13 and a top boundary close to the bottom face of top electrode assembly 14; the side boundary of confined plasma region 8 is spaced from wall 12.

Bottom electrode assembly 13, frequently referred to as a bottom electrode, is coaxial with axis 11 and is secured to electric insulating ring 17, which in turn is secured to metal, grounded base 19 of chamber 10. Electrode assembly 13 includes circular, central metal electrode 16 that is coaxial with axis 11 and has an upper surface for receiving a circular workpiece 18, typically a semiconductor wafer having a diameter substantially equal to the diameter of metal electrode 16. When workpiece 18 is properly in place its center is coincident with axis 11. Electrode 16 can be connected to a DC chucking voltage source (not shown) for clamping workpiece 18 to electrode 16 using electrostatic forces. The temperature of electrode 16 and workpiece 18 is controlled in a manner known to those skilled in the art by connecting helium source 20 to a region (not shown) in electrode 16 by way of conduit 21 and valve 22, responsive to an electric signal that controller 24 derives in response to (1) a temperature set point supplied to the controller by set point source 25 and (2) a measure of the temperature in the electrode, as indicated by a signal derived by temperature monitor 26 embedded in electrode 16.

Bottom electrode assembly 13 also includes electric insulator ring 28, typically made of quartz. Ring 28 is secured to the top face of insulator ring 17, is coaxial with axis 11 and has an inner diameter substantially equal to the diameter of workpiece 18 so that the periphery of workpiece 18, when the workpiece is properly in place, almost abuts the inner periphery of ring 28. The portion of the top face of ring 17 outside ring 28 and the side wall of ring 17 are covered by insulator ring 33 and grounded metal ring 32, respectively. Insulating ring 33 is overlaid by metal electrode ring 34 that can be covered or coated with a layer (not shown) of dielectric or conductive material. Electrically conductive ring 34 and the layer that covers or coats it are made of a material that does not contaminate the chemistry of the plasma in region 8. Such a material is a suitable relatively high conductivity semiconductor, e.g., intrinsic silicon. Alternatively, ring 34 is a metal covered by a suitable non-contaminating material. Ring 34 is electrically connected to grounded ring 32 by a metal strap (not shown) so that ring 34 is grounded. Rings 33 and 34 are coaxial with axis 11, and extend horizontally between the outer edge of bottom electrode assembly 13 and ring 28. Ring 34 preferably has an area facing region 8 equal to or greater than the area of electrode 16 to assist in having the correct ion energy of plasma incident on the workpiece.

Top electrode assembly 14 includes central electrode 36, coaxial with axis 11 and having a bottom face 36a made of electrically conductive intrinsic silicon that does not contaminate the chemistry of the plasma in region 8. Electrode 36 includes internal passages (not shown) and numerous showerhead openings (not shown), both connected in fluid flow relation to a suitable source 37 of process gases that flow through the showerhead openings into region 8 where the gases are converted into a plasma that processes workpiece 18. Electrode 36 includes a heating and/or cooling arrangement 45 responsive to an electric signal that controller 24 supplies to arrangement 45 via lead 35 in response to a set point signal supplied to the controller by set point source 25, as well as a signal indicative of the temperature of electrode 36, as derived by temperature gauge 39, embedded in assembly 14.

Assembly 14 also includes insulator ring 38 and metal ring 40. Ring 38 is coaxial with axis 11, preferably made of quartz and approximately aligned with ring 28. Ring 38 has an inner periphery abutting the outer periphery of central electrode 36. Metal ring 40, coaxial with axis 11, has inner and outer peripheries respectively abutting the outer periphery of insulator ring 38 and the inner periphery of side wall 12 so that ring 40 is at RF and DC ground potential. The lower, inner face of metal ring 40 is covered by electrical insulating ring 41 that carries an electrically conductive electrode ring 42. Electrode ring 42 is either coated or covered with a layer (not shown) of conductive or insulating material that does not contaminate the chemistry of the plasma in region 8. Ring 42 is electrically connected to ring 40 and wall 12 by a metal strap (not shown) so that ring 42 is grounded. Preferably the areas of electrodes 16 and 36 facing region 8 are the same, and the areas of grounded rings 34 and 42 are the same, so the area of ring 42 is equal to or greater than the area of electrode 36. Electrodes 16 and 36, as well as rings 34 and 42 are coaxial with axis 11.

From the foregoing, confined plasma region 8 has a top boundary determined by (1) the bottom face 36a of electrode 36, (2) the bottom face of insulator ring 38 and (3) the bottom face of electrode ring 42, and a bottom boundary determined (1) by the top face of workpiece 18 (when the workpiece is in place), (2) the top face of insulator ring 28 and (3) the top face of electrode ring 34. Motor 43 controls the spacing between the top and bottom boundaries of region 8 by moving the bottom face of top electrode assembly 14 up-and-down relative to the top face of bottom electrode assembly 13. Motor 43 responds to a signal from controller 24 to set the spacing between the faces of electrode assemblies 13 and 14 at an experimentally determined optimum value for the particular frequencies that excite the plasma processing of workpiece 18.

The sides of confined plasma region 8 are bounded by spaced, vertically stacked louvers 44, made of a material that does not contaminate the chemistry of the plasma in region 8. The louvers 44 are made of a material that is either electrically insulating (preferably a dielectric, such as quartz) or somewhat electrically conductive (e.g. silicon carbide) so that the louvers are electrically powered, or float electrically or are electrically grounded. Louvers 44 are such that no substantial amount of plasma flows through the slots between louvers 44. However, un-ionized gas in region 8 escapes through the slots between louvers 44 to region 46 in chamber 10 between wall 12 and ring 32 and is pumped from the interior of chamber 10 by pump 9 through suitable openings in base 19.

Louvers 44 are fixedly spaced from each other in the vertical direction by a suitable spacing arrangement (not shown) and are driven up and down relative to each other and to bottom assembly 13 by motor 47 to control the pressure in confined plasma region 8. The pressure in region 8 is controlled by a pressure set point that set point source 25 supplies to controller 24 and an output signal of pressure gauge 48 in region 8. Controller 24 responds to the pressure set point and the output signal of pressure gauge 48 to control motor 47, and thereby vary the spacing between the bottom face of the lowest louver 44 and the top face of electrode assembly 13. Consequently, the pressure in region 8 is maintained at the pressure set point. Louvers 44 are arranged so that the louvers do not move in response to activation of motor 43, so that the pressure in confined plasma region 8 is controlled independently of the spacing between electrode assemblies 13 and 14.

Several RF sources supply several different frequencies to region 8 via electrode 14. In particular, RF sources 50.1 . . . 50.i . . . 50.N, that can be either of fixed or variable frequency, derive plasma excitation power that is supplied to matching networks 52.1 . . . 52.i . . . 52.N, respectively, where N is an integer greater than 2 and i is sequentially each integer from 1 to N, such that i increases monotonically from 1 to N. (In the ensuing description, reference is sometimes made to sources 50.2 and 50.(N−1) and circuitry associated with them. It is to be understood that source 50.2 has the next highest frequency to source 50.1 and source 50.(N−1) has the next lowest frequency to source 50.N even though the drawings do not include such sources and related circuitry.). Combiner circuit 53 combines output power matching networks 52.1 . . . 52.N and supplies the combined power to electrode 14 via lead 58.

k RF sources 50.p . . . 50.N are respectively connected to k matching networks 55.p . . . 55.N, where k is less than N, and p is an integer including one; if p is an integer greater than one, p increases monotonically from its minimum value to N. Matching networks 55.p . . . 55.N supply power to combiner circuit 57 that supplies output power from networks 55.p . . . 55.N to electrode 36 via lead 60. (In many cases, only source 50.N, having the highest frequency, supplies power to electrode 36; in such a case combiner circuit 57 is excluded.)

Typically, power from a single source is not supplied to both electrodes 14 and 36. To supply power on a mutually exclusive basis from sources 50.P . . . 50.N to electrodes 14 and 36, switch matrix 59 is connected between sources 50.p . . . 50.N and matching networks 52.p . . . 50.N and matching networks 55.p . . . 55.N. Switch matrix 59 includes two position co-axial switches 59.p . . . 59.N, respectively associated with sources 50.p . . . 50.N, matching networks 52.p . . . 52.N and matching networks 55.p . . . 55.N. In a first position, co-axial switch 59.q of matrix 59 supplies power from source 50.q to matching network 52.q; in a second position, co-axial switch 59.q supplies power from source 50.q to matching network 55.2, wherein q is any one of p . . . N.

Each of matching networks 52.1 . . . 52.i . . . 52.N and 55.p . . . 55.N includes at least one variable reactance. If the RF sources have fixed frequency, the matching networks include two variable reactances. If the RF sources have a variable frequency, each of the matching networks has a single variable reactance.

Controller 24 controls the values of the variable reactances of matching networks 52.1 . . . 52.N and matching networks 55.p . . . 55.N, as well as the output power of each of sources 50.1 . . . 50.N. For the variable frequency embodiment, (1) each of sources 50.1 . . . 50.N has a built in nominal center frequency and circuitry for detecting the degree of mismatch between the output impedance of the particular source and circuitry for controlling the frequency of the particular source to achieve matching and (2) controller 24 sets the values of the variable reactances of matching networks 52.1 . . . 52.N, and networks 55.p . . . 55.N, in an open loop manner, based on receipes for processing workpiece 18.

For the fixed frequency embodiment, each of the matching networks 52.1 . . . 52.N and networks 55.p . . . 55.N is connected to sensor circuitry (not shown in FIG. 1) for detecting the RF voltage, current and the phase angle between them, as reflected back to the source associated with the particular matching network, and at the frequency of the particular source. Controller 24 responds to the detected voltage, current and phase angle to control a variable shunt and series capacitors of each matching network in a manner well known to those of ordinary skill in the art, so that the impedance as seen by each of the RF sources, at the output terminals thereof, is substantially equal to the output impedance of each of the sources, at the frequency of the source.

Under matched conditions, the impedances of matching networks 52.1 . . . 52.i . . . 52.N are such that the matching networks are tuned to the frequencies of sources 50.1 . . . 50.i . . . 50.N, respectively, while matching networks 55.p . . . 55.N are tuned to the frequencies of sources 50.p . . . 50.N, respectively. The matching networks are also arranged so they introduce substantial attenuation for the power of the RF sources that do not directly drive the particular matching network. Each of matching networks 52.1 . . . 52.i . . . 52.N and 55.p . . . 55.N introduces a power attenuation of at least 26 DB for the frequencies of the RF sources, except the frequency of the particular RF source that directly drives the matching network. It has been found that by introducing a power attenuation of at least 26 DB for the frequencies that do not directly drive a particular matching network, the RF source that drives a particular matching network is not adversely affected by power from the other sources, as coupled back to the output terminals of the particular RF source. For example, because matching network 52.1 introduces a power attenuation of at least 26 DB on the output power of each of RF sources 50.2 . . . 50.i . . . 50.N, the power from RF sources 50.2–50.N does not adversely affect the operation of RF source 50.1.

When switch matrix 59 is activated so that output power of matching networks 52.r–52.N (where r is any integer from p to N) is coupled to electrode 36, power at the frequencies of sources 50.1–50.(r–1) that is supplied to electrode 16 and is coupled by the plasma to electrode 36 is prevented from being coupled back from electrode 36 to matching networks 50.1–50.(r–1) by connecting lowpass filter 66 to ground by closing switch 68. Filter 66 has a cut-off frequency between the frequencies of sources 50.(r–1) and 50.r so power from sources 50.1–50.(r–1) is coupled to ground by filter 66 and is therefore decoupled from the output terminals of matching networks 52.1–52.(N–1), while power from sources 50.r–50.N is coupled to electrode 36 via matching networks 52.r–52.N, respectively. Conversely, switch 68 is opened in response to switch 55.N coupling power from source 50.N to electrode 16 via matching network 52.N. Controller 24 varies the cut-off frequency of filter 66 as a function of the sources that are coupled to electrodes 16 and 36. Hence, if switch matrix 59 is activated so power from sources 50.1–50.s is coupled to electrode 16 and power from sources 50.(s+1)–50.N is coupled to electrode 36, controller 24 causes the cut-off frequency of filter 66 to be between the frequencies of sources 50.s and 50.(s+1).

Control over the electric fields between the electrodes of bottom assembly 13 and top assembly 14 and thereby over the plasma incident on workpiece 18 is provided, inter alia, by detecting the DC bias voltages of electrodes 16 and 36 with DC bias detectors 70 and 71. Detectors 70 and 71 are respectively connected in a DC circuit to electrodes 16 and 36 and respectively detect the DC bias voltages that are induced on electrodes 16 and 36 in response to the RF electric fields coupled by electrode assemblies 13 and 14 to the plasma in region 8.

Detectors 70 and 71 respectively supply signals indicative of the DC bias voltages of electrodes 16 and 36 to controller 24. Controller 24 responds to the signals that DC bias detectors 70 and 71 derive to control variable impedances of grounding circuit 72 and 73, respectively. Each of grounding circuits 72 and 73 includes a separate series resonant circuit having a resonant frequency nominally equal substantially to the frequency of one of the RF sources driving the electrode opposite to the electrode with which the grounding circuit is connected; e.g. if source 50.N drives electrode 36, the nominal resonant frequency of ground network 70, connected to electrode 16, equals the frequency of source 50.N. Controller 24 responds to (1) the indications of DC bias voltages that detectors 70 and 71 derive and (2) set points for the DC bias voltages to control a variable reactance (either an inductance or capacitor) of the series resonant circuit in each of grounding circuits 72 and 73. Thereby, the intensity and shape of electric field lines between the electrodes of assemblies 13 and 14 and the characteristics of the plasma incident on workpiece 18 are controlled. In particular, the electric field lines between electrodes 16 and 36, and between electrodes 16 and 42, and between electrodes 16 and 34 are controlled in response to the DC bias voltages that detectors 70 and 71 sense and the DC bias voltage set points for these DC bias voltages.

To assist in providing the desired degree of attenuation for the frequencies that are not derived from a particular RF source, the output terminals of RF sources 50.–50.N are respectively connected to shunt inductors 80.–80.N. Inductors 80.–80.N function as lowpass filters, so that each of inductors 80.–80.N shunts power from the lowest frequency RF source 50.1 to ground. Hence, any power from source 50.1 that is coupled through matching networks 52.–52.N is prevented from affecting RF sources 50.–50.N, respectively. Similarly, inductors 80.–80.N couple power from RF sources 50.1 and 50.2 to ground and prevent the output terminals of RF sources 50.–50.N from having power from sources 50.1 and 50.2 being coupled to them.

In a typical vacuum plasma processing chamber, there is a significant amount of distributed capacitance between electrode 16 of bottom assembly 13 and ground. The distributed capacitance between electrode 16 and ground has been found to have an adverse effect on matching the output impedances of sources 50.1 . . . 50.t having the lowest frequencies. Series resonant circuits 82.1, 82.t, connected in shunt between ground and the outputs of matching networks 52.–52.t, assist in achieving matching of the output terminals of sources 50.–50.t to the impedance reflected back to the sources. Series resonant circuits 82.–82.t respectively include fixed inductors 84.–84.t and fixed capacitors 86.–86.t. Circuit 82.u has a resonant frequency between the frequencies of RF sources 50.u and 50.(u+1). In one example, RF sources 50.1 and 50.2 have frequencies of 2.0 MHz and 27 MHz. To achieve the proper impedance match without adversely affecting the output powers of matching networks 52.1 and 52.2, inductor 84.1 and capacitor 86.1 have values so that they are resonant at a frequency of approximately 5.0 MHz in the foregoing example. The quality factor (O) of inductors 84.1 . . . 84.μ is sufficiently high that shunt resonant circuits 82.–82.u does not cause any substantial attenuation of the power that matching networks 52.–52.t respectively supply to electrode 16.

When switch matrix 59 is activated so that source 50.N supplies power to electrode 36 via matching network 52.N, power at the frequencies of sources 50.1–50.(N–1) that is incident on electrode 36 is prevented from being coupled back to combiner circuit 56 and matching networks 50.–50.N by connecting lowpass filter 66 to ground by closing switch 68. Filter 66, having a cut-off frequency between the frequencies of sources 50.(N–1) and 50.N, is decoupled from circuit 56, while power from source 50.N is coupled from circuit 56 to electrode 36. Switch 68 is ganged with switch 59.N, so that switch 68 is open circuited in response to switch 59.N coupling power from source 50.N to matching network 52.N. Conversely, switch 68 is closed in response to switch 59.N coupling power from source 50.N to matching network 55.N.

Figure 2:
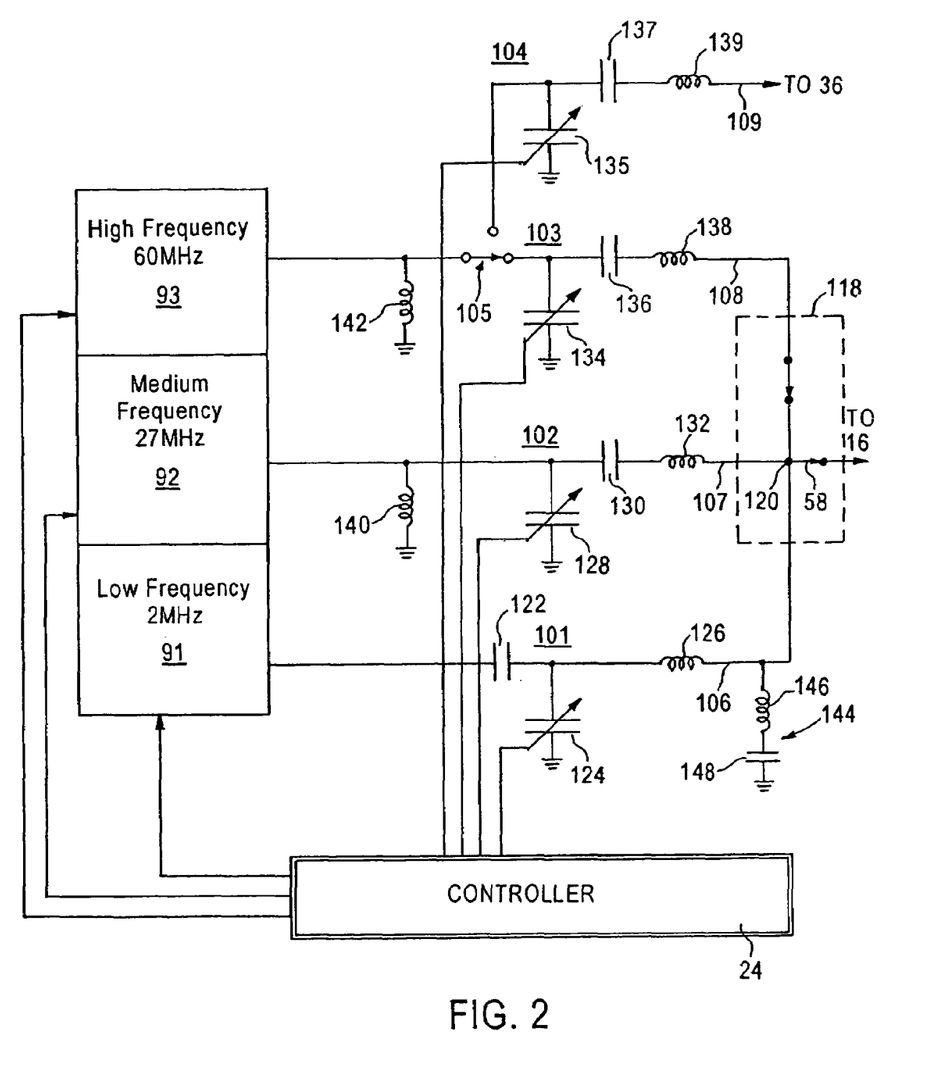
FIG. 2 is a circuit diagram of a portion of the apparatus illustrated in FIG. 1, according to one arrangement.

Reference is now made to FIG. 2 of the drawing, a partial block and partial electrical schematic diagram of a specific circuit for supplying power to electrode 16 or to electrodes 16 and 36. In the circuit of FIG. 2, N=3 and there are three variable frequency RF sources 91, 92 and 93, respectively having center frequencies of 2 MHz, 27 MHz and 60 MHz. Sources 91, 92 and 93 include circuitry for varying the frequencies thereof from the center frequencies thereof by about ±5%. Sources 91, 92 and 93 control the frequency of the sources by sensing the impedance mismatch between the output impedances of the sources and the impedances the sources drive. Output power of sources 91 and 92 is respectively applied to matching networks 101 and 102 by way of a direct connection. Output power of source 93 is selectively supplied to matching network 103 or 104 by co-axial switch 105. Combiner circuit 118 combines power at the output terminals of matching networks 101, 102 and 103 and supplies the combined power to electrode 16 via lead 58 so that electrode 16 is driven by power sources 91, 92 and 93 in response to controller 24 activating switch 105 to supply power from source 93 to matching network 103. Under these conditions sources 91, 92 and 93 and matching networks 101, 102 and 103 do not directly supply power to electrode 36. In response to controller 24 activating switch 105 so power from source 93 is supplied to matching network 104 to the exclusion of network 103, electrode 36 is driven by power from source 93 via network 104, while sources 91 and 92 respectively drive electrode 16 via networks 101 and 102 and combiner 118.

Matching networks 101, 102, 103 and 104 respectively supply power to leads 106, 107, 108 and 109 at the frequencies of sources 91, 92, 93 and 93. Based on the foregoing, the power on each of leads 106, 107 and 108, at the frequencies of sources of 91, 92 and 93, is supplied only to electrode 16 under a first scenario; alternatively, under a second scenario the power on leads 106 and 107 is supplied to electrode 16 while the power on lead 109 is supplied to electrode 36.

Controller 24 responds to stored signals in a memory (not shown). The stored signals depend on desired properties of workpiece 18 to control variable shunt capacitors of matching networks 101, 102 and 103, in an open loop manner.

To achieve the 26 DB power attenuation of energy that is not at the same frequency as the energy driving a particular matching network, each of matching networks 101, 102, 103 and 104 includes a variable shunt capacitor, a fixed series capacitor and a fixed inductor. Matching network 101 includes variable shunt capacitor 124 that is connected between fixed series capacitor 122 and fixed inductor 126. Matching network 102 includes fixed series capacitor 130 that is connected between variable shunt capacitor 128 and fixed series inductor 132. Matching network 103 includes variable shunt capacitor 134, fixed series capacitor 136 and a fixed known amount of series inductance, in the form of distributed inductance, represented in FIG. 2 by series inductor 138. Matching network 104 includes variable shunt capacitor 135, fixed series capacitor 137 and a fixed known amount of series inductance, in the form of distributed inductance, represented in FIG. 2 by series inductor 139.

Controller 24 responds to the stored receipe determined signals to control the values of variable, shunt capacitors 124, 128 and 134. It is to be understood that DC motors (not shown) are typically employed to vary the values of capacitors 124, 128, 134 and 135 or that each of the variable capacitors can have many fixed values that are connected in circuit by switches. Controller 24 varies the values of capacitors 124, 128, 134 and 135 to assist in achieving impedance matching of sources 91, 92, 93 and 93, respectively.

Typical values of capacitors 122, 130, 136 and 137 are 600 picofarads, 110 picofarads, and 40 picofarads and 100 picofarads, respectively. A typical value of fixed inductor 126 is in the range of 15–20 microhenries, while a typical value of inductor 132 is in the range of 50–100 nanohenries, and a typical distributed inductance of each of matching networks 103 and 104, as represented by inductors 138 and 139, is less than 50 nanohenries. It is to be understood that inductors 126 and 132 can be variable inductors, if the required matching effect cannot otherwise be achieved. Typical values of variable, shunt capacitor 124 are in the range of 300–600 picofarads; typical values of variable, shunt capacitor 128 are in the range of 50–1000 picofarads; typical values of variable, shunt capacitor 134 are in the range of 20–330 picofarads; and typical values of variable shunt capacitor 135 are in the range of 20–300 picofarads. The foregoing values of the components of matching networks 101, 102, 103 and 104 enable the matching networks to provide the desired power attenuation to prevent unwanted frequencies from being coupled back to the source that drives the particular matching network. In addition, the foregoing values enable each of matching networks 101, 102, 103 and 104 to be approximately tuned (i.e. resonant) to the frequencies of sources 91, 92 and 93, respectively. Hence, matching networks 101, 102, 103 and 104 respectively have low impedances for the frequencies of sources 91, 92, 93 and 93. However, matching network 101 inserts a power attenuation of at least 26 DB for the frequencies of sources 92 and 93, matching network 102 inserts a power attenuation of at least 26 DB for the frequencies of sources 91 and 93, and each of matching networks 103 and 104 inserts a power attenuation of at least 26 DB for the frequencies of sources 91 and 92.

To prevent the relatively high power of low frequency source 91 from being coupled back to the output terminals of sources 92 and 93, shunt inductors 140 and 142 are respectively connected across the output terminals of sources 92 and 93. Inductors 140 and 142 have high impedances to the frequencies of sources 92 and 93, but have low impedances to the frequency of source 91. Hence, any power from source 91 that might be coupled through matching networks 102, 103 and 104 toward sources 92, 93 and 93, respectively, is prevented from reaching these sources by shunt inductors 140 and 142. Because shunt inductors 140 and 142 have high impedances at the frequencies of sources 92 and 93, virtually no power from sources 92 and 93 is coupled to ground through inductors 140 and 142, respectively.

Bottom electrode 16 has a substantial parasitic, i.e., distributed, capacitance to ground. To assist in providing an impedance match between source 91 and the impedance of electrode 16, series resonant circuit 144 is connected between lead 104 and ground. Circuit 144 includes series connected inductor 146 and capacitor 148. Circuit 144 has a resonant frequency of approximately 5 MHz, i.e., approximately one octave above the frequency of source 91 and approximately two and a half octaves below the frequency of source 92. Inductor 146 has a relatively high Q so that series resonant circuit 144 has a relatively narrow bandwidth and does not shunt significant power from source 91 or source 92 to ground.

The overall effect of the circuit of FIG. 2 is to provide the desired low impedance for the sources 91, 92 and 93 driving electrode 16 or electrodes 16 and 36, while introducing sufficient attenuation to prevent damage to sources 91, 92 and 93 and attain the desired impedance match.

Figure 3:
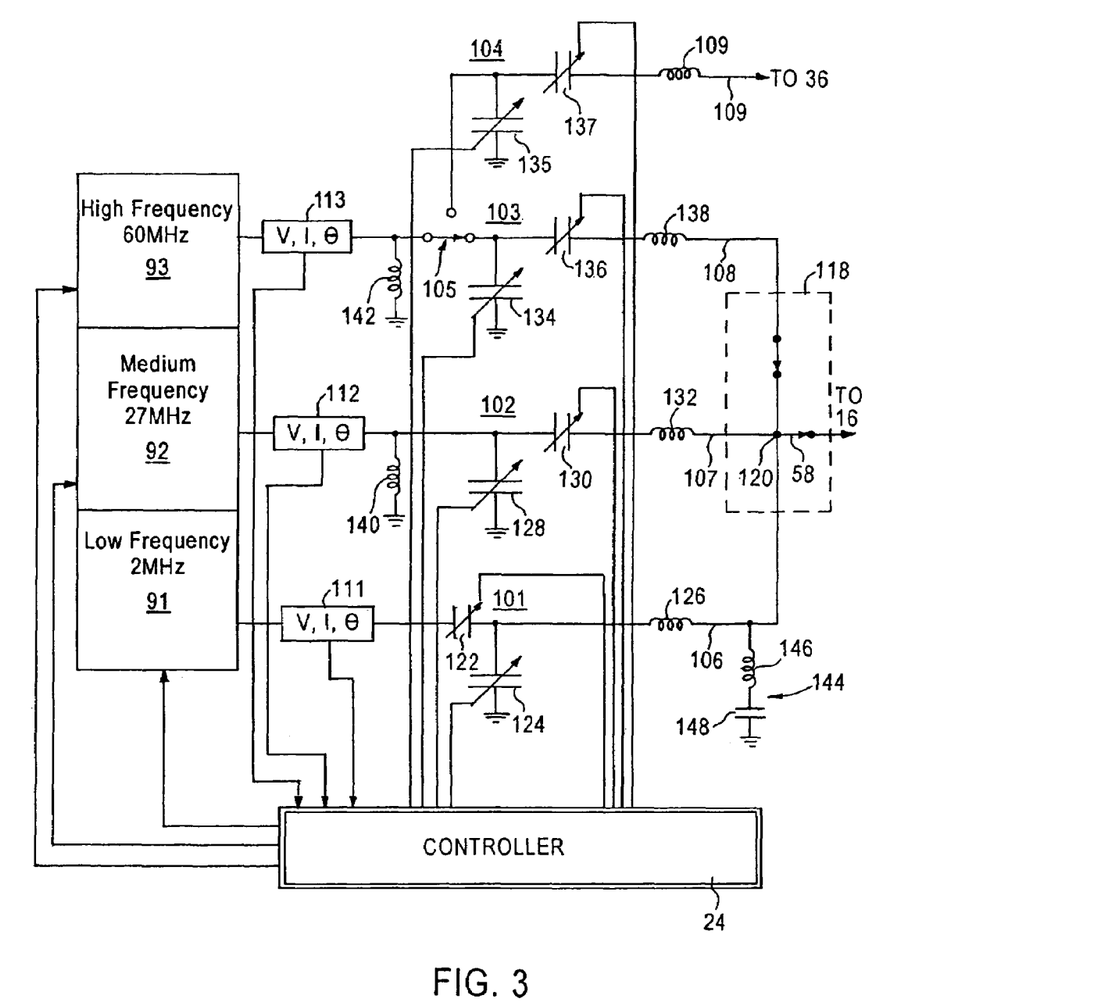
FIG. 3 is a circuit diagram of a portion of the apparatus illustrated in FIG. 1, according to a second arrangement.

Reference is now made to FIG. 3 of the drawing, a block diagram of circuitry for driving electrodes 16 and 36, wherein sources 91, 92 and 93 have fixed frequencies of 2 MHz, 27 MHz and 60 MHz, respectively, and impedance matching is achieved by changing fixed capacitors 122, 130 and 136 to variable capacitors. The circuit of FIG. 3 includes sensors 111, 112 and 113, connected directly to the output terminals of sources 91, 92 and 93, respectively. Sensors 111, 112 and 113 detect the magnitude of the voltage and current reflected back to sources 91, 92 and 93 (at the frequencies of the particular source directly driving the particular source), respectively, and the phase angle between the reflected voltage and currents. Controller 24 responds to the signals from detectors 111, 112 and 113 to control the values of variable, series capacitors 122, 130, 136 and 137 to achieve the desired impedance match. To achieve the desired impedance match, capacitor 122 typically has values in the range of 50–1,000 picofarads, capacitor 130 typically has values in the range of 50–1,000 picofarads, and each of capacitors 136 and 137 typically has values in the range of 20–330 picofarads. Motors (not shown) respond to signals from controller 24 to vary the values of capacitors 122, 130, 136 and 137. The stated range of values for capacitors 122, 130, 136 and 137 enables impedance matching to be achieved. In addition, matching networks 101, 102, 103 and 104 respectively have resonant frequencies approximately equal to the frequencies of sources 91, 92, 93 and 93. Matching networks 101, 102, 103 and 104 also provide the desired attenuation for frequencies that do not directly drive the matching networks.

Figure 4:
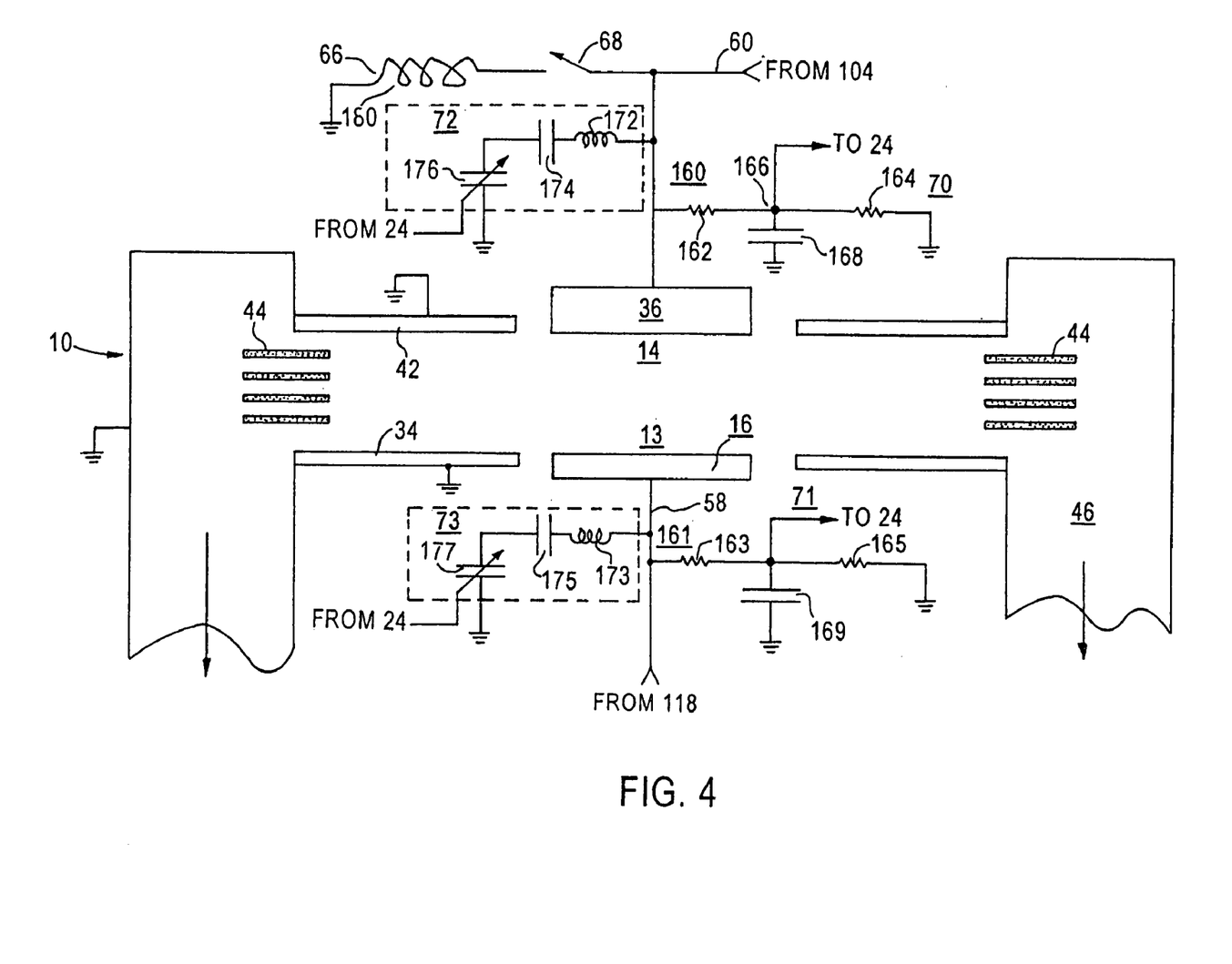
FIG. 4 is a circuit diagram of a further portion of the apparatus illustrated in FIG. 1.

Reference is now made to FIG. 4 of the drawing, a schematic diagram of circuitry for controlling the electric field lines between electrodes 16, 34, 36 and 42 in vacuum plasma processing chamber 10, including louvers 44. The circuitry of FIG. 4 is driven by the sources of FIG. 2 or FIG. 3. As schematically illustrated in FIG. 4, electrodes 16 and 36 are center electrodes, with electrode 16 arranged to carry the workpiece. Electrodes 16 and 36 are coaxial with each other and centrally located in chamber 10, while electrode 34 is formed as a ring, surrounding and spaced from the periphery of electrode 16. The upper faces of electrodes 16 and 34 are co-planar. Electrode 36 has a diameter approximately one third greater than that of electrode 16, and is surrounded by and spaced from ring electrode 42. Electrodes 34 and 42 are grounded. Because of substantial parasitic capacitance associated with electrode 36, it is difficult to ground electrode 36, particularly for the frequencies of source 92. Because of substantial parasitic capacitance associated with electrode 16, it is difficult to ground electrode 16 for the frequency of source 93. It is frequently desired to ground electrode 16 for the frequency of source 93 when source 93 drives electrode 36 directly as a result of source 93 being connected by switch 105 to drive matching network 104.

Grounding circuit 72 responds to the DC bias voltage of electrode 16, as coupled by DC bias detector 70 to controller 24. Grounding circuit 72 includes a variable impedance that is controlled by the DC bias voltage of electrode 16 to control the electric fields at 60 MHz between electrodes 16, 34, 36 and 42. In particular, circuit 72 has a series resonant circuit having a variable resonant frequency centered about 60 MHz. The series resonant circuit is connected between electrode 16 and ground.

Grounding circuit 73 responds to the DC bias voltage of electrode 36, as coupled by DC bias detector 71 to controller 24. Grounding circuit 73 includes a variable impedance that is controlled by the DC bias voltage of electrode 16 to control the electric fields at 27 MHz between electrodes 36, 34, 16 and 42. In particular, circuit 73 has a series resonant circuit having a variable resonant frequency centered about 27 MHz. The series resonant circuit is connected between electrode 36 and ground.

DC bias detector 70 includes a resistive voltage divider 160, including resistors 162 and 164, typically having values of 10 megohms and 10 kilohms, respectively. Tap 166 between resistors 162 and 164 is connected to ground by capacitor 168, typically having a value of approximately one microfarad so that the voltage at tap 166 includes no substantial AC components and is an accurate indication of the DC bias voltage developed at electrode 16 in response to the excitation of the confined plasma in region 8. The DC voltage at tap 166 is coupled to controller 24.

Grounding circuit 72 includes shunt circuit 170 connected between electrode 16 and ground. Shunt circuit 170 consists of passive components and includes fixed inductor 172, fixed capacitor 174 and variable capacitor 176, all connected in series with each other. The values of inductor 172 and capacitors 174 and 176 are such that circuit 170 has a relatively fixed impedance for the 2 MHz and 27 MHz frequencies of sources 91 and 92, but a variable impedance for the frequency of 60 MHz frequency of source 93. Typically, capacitor 174 has a value of approximately 100 picofarads, while capacitor 176 has a value in the range of 20–400 picofarads, depending on the DC bias voltage at tap 166 and a set point value for the DC bias voltage. Controller 24 responds to the voltage at tap 166 to vary the value of capacitor 176 to enable the set point value for the DC bias voltage to be achieved. Controller 24 drives a motor (not shown) to vary the value of capacitor 176.

The set point value for the DC bias voltage is determined by the desired relationship for the electric field lines between electrodes 16, 34, 36 and 42. If it is desired for the electric field lines at 60 MHz to be primarily between electrodes 16 and 36, the DC bias set point is such that circuit 170 is a series resonant circuit having a resonant frequency equal to 60 MHz. Thereby, a very low impedance subsists between electrode 16 and ground and a significant percentage of the current at 60 MHz flows from electrode 36 to electrode 16, thence to ground through circuit 170 and strong 60 MHz electric field lines exist between electrodes 36 and 16. Under these conditions, there are relatively weak 60 MHz electric field lines between electrodes 16 and 42 and between electrodes 16 and 34, and somewhat stronger 60 MHz electric field lines between electrodes 36 and 34. If, however, it is desired for the 60 MHz electric field lines between electrodes 36 and 42 to be greater than the electric field lines between electrodes 36 and 16, the set point for the DC bias voltage is at a value causing capacitor 176 to be varied so the impedance of circuit 170 at 60 MHz is relatively high, compared to the impedance of circuit 170 when circuit 170 is resonant to the 60 MHz frequency of source 93. In response to capacitor 176 being driven so the value thereof causes circuit 170 to have a high impedance to the 60 MHz output of source 93, the electric field lines between electrodes 36 and 16 are relatively weak, while the electric field lines between electrode 36 and electrode 34 are relatively strong, as are the electric field lines between electrode 36 and electrode 34.

DC bias detector 71 includes a resistive voltage divider 161, including resistors 163 and 165, typically having values of 10 megohms and 10 kilohms, respectively. Tap 167 between resistors 163 and 165 is connected to ground by capacitor 169, typically having a value of approximately one microfarad so that the voltage at tap 167 includes no substantial AC components and is an accurate indication of the DC bias voltage developed at electrode 36 in response to the excitation of the confined plasma in region 8. The DC voltage at tap 167 is coupled to controller 24.

Grounding circuit 73 includes shunt circuit 171 connected between electrode 36 and ground. Shunt circuit 171 consists of passive components and includes fixed inductor 173, fixed capacitor 175 and variable capacitor 177, all connected in series with each other. The values of inductor 173, and capacitors 175 and 177 are such that circuit 171 has a relatively fixed impedance for the 2 MHz and 60 MHz frequencies of sources 91 and 93, but a variable impedance for the frequency of 27 MHz frequency of source 92. Typically, capacitor 175 has a value of approximately 120 picofarads, while capacitor 177 has a value in the range of 50–1000 picofarads, depending on the DC bias voltage at tap 167 and a set point value for the DC bias voltage. Controller 24 responds to the voltage at tap 167 to vary the value of capacitor 177 to enable the set point value for the DC bias voltage to be achieved. Controller 24 drives a motor (not shown) to vary the value of capacitor 167.

The set point value for the DC bias voltage is determined by the desired relationship for the electric field lines between electrodes 36, 34, 16 and 42. If it is desired for the electric field lines at 27 MHz to be primarily between electrodes 36 and 16, the DC bias set point is such that circuit 171 is a series resonant circuit having a resonant frequency equal to 27 MHz. Thereby, a very low impedance subsists between electrode 36 and ground and a significant percentage of the current at 27 MHz flows from electrode 16 to electrode 36, thence to ground through circuit 171 and strong 27 MHz electric field lines exist between electrodes 16 and 36. Under these conditions, there are relatively weak 27 MHz electric field lines between electrodes 36 and 42, and between electrodes 36 and 34, and somewhat stronger 27 MHz electric field lines between electrodes 16 and 34. If, however, it is desired for the 27 MHz electric field lines between electrodes 16 and 42 to be greater than the electric field lines between electrodes 16 and 36, the set point for the DC bias voltage is at a value causing capacitor 177 to be varied so the impedance of circuit 171 at 27 MHz is relatively high, compared to the impedance of circuit 171 when circuit 171 is resonant to the 27 MHz frequency of source 92. In response to capacitor 177 being driven so the value thereof causes circuit 171 to have a high impedance to the 27 MHz output of source 92, the electric field lines between electrodes 16 and 36 are relatively weak, while the electric field lines between electrode 16 and electrode 34 are relatively strong, as are the electric field lines between electrode 16 and electrode 34.

To further assist in decoupling the 2 MHz and 27 MHz energy that is incident on electrode 36 while switch and combiner circuit 118 is activated so the 60 MHz output of source 92 is coupled to electrode 36, filter 66 is connected by relay 68 in shunt with electrode 36. As illustrated in FIG. 4, filter 66 comprises inductor 180 that is connected to electrode 36 that controller 24 activates simultaneously with activating the switch of circuit 118 so the output of high frequency source 93 is coupled to electrode 36 via lead 60. Inductor 180 has a sufficiently high value and large impedance at the 60 MHz frequency of source 93 to prevent the 60 MHz energy from being coupled to ground. However, the value of inductor 180 is such as to present a relatively low impedance to the 2 MHz and 27 MHz frequencies of sources 91 and 92, to prevent coupling of the 2 MHz and 27 MHz energy incident on electrode 36 from back to circuit 118.

While there have been described and illustrated a specific embodiment of the invention, it will be clear that variations in the details of the embodiment specifically illustrated and described may be made without departing from the true spirit and scope or the invention as defined in the appended claims.

We claim:

1. A vacuum plasma processor comprising:
    a vacuum plasma chamber for processing a workpiece, the chamber including a first electrode assembly arranged to be electrically coupled with gas in the chamber and a second electrode assembly arranged to be electrically coupled with gas in the chamber, the first electrode assembly including a first electrode, the second electrode assembly including second and third electrodes spaced from each other;
    an AC electric source arrangement connected to at least one of said electrodes, the AC source arrangement having sufficient power to excite the gas in the chamber to a plasma;
    the chamber and the electrode assemblies being arranged for causing (a) plasma exciting AC electric fields at a frequency of the source arrangement to subsist between the first and second electrode assemblies and (b) a DC bias voltage to be developed on at least one of said electrodes in response to the gas in the chamber being excited to a plasma;
    a detector for the DC bias voltage; and
    circuitry connected to be responsive to the detector for controlling the plasma exciting AC electric fields;
    the first assembly including a fourth electrode at least substantially surrounding the first electrode; the fourth electrode being coaxial with the first, second and third electrodes and having a circular periphery and being substantially coplanar with the first electrode; the chamber and electrode assemblies being arranged for causing third electric field lines at an AC frequency of the source arrangement to subsist between the first and fourth electrodes; the chamber, electrode assemblies and the circuitry being arranged for causing the circuitry to affect the third electric field lines in response to the detected DC bias voltage.

2. The vacuum plasma processor of claim 1 wherein the chamber and the electrode assemblies are arranged for causing (a) first electric field lines at said AC frequency to subsist between the first electrode and at least one of the second and third electrodes and (b) second electric field lines at said AC frequency to subsist between the second and third electrodes; the chamber, the electrode assemblies and the circuitry being arranged for causing the circuitry to affect at least one of the first or second electric field lines in response to the detected DC bias voltage.

3. The vacuum plasma processor of claim 2 wherein the second electrode is at least substantially surrounded by the third electrode.

4. The vacuum plasma processor of claim 3 wherein the second and third electrodes are substantially coplanar and are in a plane different from a plane in which the first electrode is located.

5. The vacuum plasma processor of claim 4 wherein the first, second and third electrodes are coaxial and have circular peripheries.

6. The processor of claim 1 wherein the chamber and electrode assemblies are arranged for causing (a) plasma exciting AC electric field lines at frequencies of the source arrangement to subsist between the first and second electrode assemblies and (b) DC bias voltages to be developed on at least one of said electrodes in response to the gas in the chamber being excited to a plasma and the detector being included in a detector arrangement for the DC bias voltage; and circuitry for affecting the AC electric field lines based on indications of the detected DC bias voltage on at least one of the electrodes.

7. The vacuum plasma processor of claim 1 wherein the chamber, the electrode assemblies and the circuitry are arranged for causing the circuitry to affect the first electric field lines in response to the detected DC bias voltage.

8. The vacuum plasma processor of claim 7 wherein the chamber, the electrode assemblies and the circuitry are arranged for causing the circuitry to affect the second electric field lines in response to the detected DC bias voltage.

9. The vacuum plasma processor of claim 1 wherein the chamber, the electrode assemblies and the circuitry are arranged for causing the circuitry to affect the second electric field lines in response to the detected DC bias voltage.

10. The vacuum plasma processor of claim 2 wherein the chamber, the electrode assemblies and the circuitry are arranged for causing the circuitry to affect the first electric field lines in response to the detected DC bias voltage.

11. The vacuum plasma processor of claim 10 wherein the chamber, the electrode assemblies and the circuitry are arranged for causing the circuitry to affect the second electric field lines in response to the detected DC bias voltage.

12. The vacuum plasma processor of claim 1 wherein the circuitry includes a variable impedance connected to one of the electrodes, the variable impedance being arranged to have a value controlled in response to the detected DC bias voltage.

13. The vacuum plasma processor of claim 2 wherein the chamber, the electrode assemblies and the circuitry are arranged for causing the circuitry to affect the second electric field lines in response to the detected DC bias voltage.

14. The vacuum plasma processor of claim 13 wherein the first assembly includes a fourth electrode; the chamber and the electrode assemblies being arranged for causing third electric field lines at said AC frequency to subsist between the first and fourth electrodes; the chamber, the electrode assemblies and the circuitry being arranged for causing the circuitry to affect the third electric field lines in response to the detected DC bias voltage.

15. The vacuum plasma processor of claim 2 wherein the first assembly includes a fourth electrode; the chamber and the electrode assemblies being arranged for causing third electric field lines at an AC frequency of the source assembly to subsist between the first and fourth electrodes; the chamber, the electrode assemblies and the circuitry being arranged for causing the circuitry to affect the third electric field lines in response to the detected DC bias voltage.

16. The vacuum plasma processor of claim 12 wherein the circuitry includes a variable impedance connected to the second electrode, the second electrode being substantially surrounded by the third electrode, the second and third electrodes being substantially coplanar and in a plane different from the first electrode, the variable impedance being arranged to have a value controlled in response to the detected DC bias voltage, the variable impedance being connected between the second electrode and a reference potential.

17. The vacuum plasma processor of claim 16 wherein the variable impedance is connected between said one of the electrodes and a reference potential.

18. The vacuum plasma processor of claim 17 wherein the variable impedance is a reactance of a series tuned circuit.

19. The vacuum plasma processor of claim 18 wherein the variable impedance is included in a branch consisting of passive components.

20. The vacuum plasma processor of claim 19 wherein said one of the electrodes is the second electrode.

21. The vacuum plasma processor of claim 20 wherein the second electrode is substantially surrounded by the third electrode and the second and third electrodes are substantially coplanar and in a plane different from the first electrode.

22. The vacuum plasma processor of claim 16 wherein the variable impedance is a reactance of a series tuned circuit.

23. The vacuum plasma processor of claim 22 wherein the variable impedance is included in a branch consisting of passive components.

24. A method of processing a workpiece in a vacuum plasma processor chamber, the chamber being associated with a reactance that couples AC electric energy to gas in the chamber, the chamber including an electrode, circuitry connected between the electrode and a reference potential, the method comprising:
exciting the gas in the chamber to a plasma by supplying AC electric energy to at least one of the electrode and said reactance, the AC energy supplied to the gas via said reactance having sufficient power to cause (a) plasma exciting AC electric fields at a frequency of the supplied AC electric energy to subsist between the reactance and the electrode, and (b) a DC bias voltage to be developed on said electrode in response to the gas in the chamber being excited to a plasma; and
varying an impedance of the circuitry in response to an indication of the DC bias voltage, the impedance being a reactance of a series tuned circuit.

25. The method of claim 24 wherein the impedance is a reactance of a series tuned circuit in a branch consisting of passive components.

26. A method of processing a workpiece in a vacuum plasma processor chamber, the chamber being associated with a reactance that couples AC electric energy to gas in the chamber, the chamber including an electrode, circuitry connected between the electrode and a reference potential, the method comprising:
exciting the gas in the chamber to a plasma by supplying AC electric energy, at plural frequencies to the electrode and/or said reactance, the AC energy supplied to the gas via the electrode and/or said reactance causing (a) plasma exciting AC electric fields at a frequency of the supplied AC electric energy to subsist between the reactance and the electrode, and (b) a DC bias voltage to be developed on said electrode in response to the gas in the chamber being excited to a plasma; and
varying an impedance of the circuitry in response to an indication of the DC bias voltage.

27. The method of claim 26 wherein the reactance is another electrode so that a DC bias voltage is developed on the another electrode, and further including responding to the DC bias voltage developed on the another electrode by controlling the AC energy supplied to the plasma at the plural frequencies.

28. A vacuum plasma processor comprising:
a vacuum plasma chamber for processing a workpiece, the chamber including a first electrode assembly arranged to be electrically coupled with gas in the chamber and a second electrode assembly arranged to be electrically coupled with gas in the chamber, the first electrode assembly including a first electrode, the second electrode assembly including second and third electrodes spaced from each other;
an AC electric source arrangement connected to at least one of said electrodes, the AC source arrangement having sufficient power to excite the gas in the chamber to a plasma;
the chamber and the electrode assemblies being arranged for causing (a) plasma exciting AC electric fields at a frequency of the source arrangement to subsist between the first and second electrode assemblies and (b) a DC bias voltage to be developed on at least one of said electrodes in response to the gas in the chamber being excited to a plasma;

a detector for the DC bias voltage; and circuitry for controlling the plasma exciting AC electric fields;

the chamber and the electrode assemblies being arranged for causing (a) first electric field lines at said frequency to subsist between the first electrode and at least one of the second and third electrodes and (b) second electric field lines at said AC frequency to subsist between the second and third electrodes; the chamber, the electrode assemblies and the circuitry being arranged for causing the circuitry to affect the first and second electric field lines based on an indication of the detected DC bias voltage.

29. The processor of claim 28 wherein the chamber and electrode assemblies are arranged for causing (a) plasma exciting AC electric field lines at frequencies of the source arrangement to subsist between the first and second electrode assemblies and (b) DC bias voltages to be developed on at least one of said electrodes in response to the gas in the chamber being excited to a plasma and the detector being included in a detector arrangement for the DC bias voltage; and circuitry for affecting the AC electric field lines based on indications of the detected DC bias voltage on at least one of the electrodes.

30. The vacuum plasma processor of claim 28 wherein the first assembly includes a fourth electrode; the chamber and the electrode assemblies being arranged for causing third electric field lines at said AC frequency to subsist between the first and fourth electrodes; the chamber, the electrode assemblies and the circuitry being arranged for causing the circuitry to affect the third electric field lines based on an indication of the detected DC bias voltage.

31. The vacuum plasma processor of claim 28 wherein the circuitry includes a variable impedance connected to one of the electrodes, the variable impedance being arranged to have a value controlled based on the indication of the detected DC bias voltage.

32. The vacuum plasma processor of claim 31 wherein the variable impedance is connected between said one of the electrodes and a reference potential.

33. The vacuum plasma processor of claim 32 wherein the variable impedance is a reactance of a series tuned circuit.

34. The vacuum plasma processor of claim 33 wherein the variable impedance is included in a branch consisting of passive components.

35. The vacuum plasma processor of claim 34 wherein said one of the electrodes is the second electrode.

36. The vacuum plasma processor of claim 35 wherein the second electrode is substantially surrounded by the third electrode and the second and third, electrodes are substantially coplanar and in a plane different from the first electrode.

37. The vacuum plasma processor of claim 31 wherein the variable impedance is connected to the second electrode, the second electrode being substantially surrounded by the third electrode, the second and third electrodes being substantially coplanar and in a plane different from the first electrode, the variable impedance being arranged to have a value based on the indication of the detected DC bias voltage, the variable impedance being connected between the second electrode and a reference potential.

38. A method of processing a workpiece in a vacuum plasma processor chamber, the chamber including a first electrode assembly that couples AC electric energy to gas in the chamber and a second electrode assembly electrically coupled to gas in the chamber, the first electrode assembly including a first electrode, the second electrode assembly including second and third electrodes spaced from each other; the method comprising:

exciting the gas in the chamber to a plasma by supplying AC electric energy with sufficient power to at least one of said electrodes, the AC energy supplied to the gas via said at least one of said electrodes causing (a) plasma exciting AC electric fields at a frequency of the supplied AC electric energy to subsist between the first and second electrode assemblies and (b) a DC bias voltage to be developed on at least one of said electrodes in response to the gas in the chamber being excited to a plasma; and controlling the plasma exciting AC electric fields in response to an indication of the DC bias voltage by causing (a) first electric field lines at said frequency to subsist between the first electrode and the second and third electrodes and (b) second electric field lines at said frequency to subsist between the second and third electrodes; and affecting the first and second electric field lines based on the indication of the DC bias voltage.

39. The method of claim 38 wherein the first assembly includes a fourth electrode and further including causing third electric field lines at said frequency to subsist between the first and fourth electrodes, the method further including affecting the third electric field lines based on the indication of the DC bias voltage.

40. A vacuum plasma processor comprising:

a vacuum plasma chamber for processing a workpiece, the chamber being associated with a reactance for electrical coupling with gas in the chamber, the chamber including an electrode assembly arranged for electrical coupling with gas in the chamber, the electrode assembly including a first electrode;

an AC electric source arrangement connected to said reactance, the AC source arrangement having sufficient power to excite the gas in the chamber to a plasma;

the chamber, the reactance and the electrode assembly being arranged for causing (a) plasma exciting AC electric fields at a frequency of the source arrangement to subsist between the reactance and electrode assembly and (b) a DC bias voltage to be developed on an electrode of the electrode assembly in response to the gas in the chamber being excited to a plasma;

a detector for the DC bras voltage; and circuitry connected to be responsive to the detector for controlling the plasma exciting AC electric fields;

the circuitry including a variable impedance connected to the second electrode the variable impedance being arranged to have a value based on an indication of the detected DC bias voltage and being a reactance of a series tuned circuit.

41. The processor of claim 40 wherein the chamber and electrode assemblies are arranged for causing (a) plasma exciting AC electric field lines at frequencies of the source arrangement to subsist between the first and second electrode assemblies and (b) DC bias voltages to be developed on at least one of said electrodes in response to the gas in the chamber being excited to a plasma and the detector being included in a detector arrangement for the DC bias voltage; and circuitry for affecting the AC electric field lines based on indications of the detected DC bias voltage on at least one of the electrodes.

42. The vacuum plasma processor of claim 40 wherein the variable impedance is connected between the second electrode and a reference potential.

43. The vacuum plasma processor of claim 40 wherein the variable impedance is included in a branch consisting of passive components.

44. The vacuum plasma processor of claim 43 wherein the circuitry is connected between the first electrode and a reference potential, the electrode assembly including a second electrode substantially surrounding the first electrode, the first and the second electrodes being substantially coplanar and in a plane different from the reactance, the second electrode being connected to the reference potential.

45. The vacuum plasma processor of claim 40 wherein the circuitry is connected between the first electrode and a reference potential, the electrode assembly including a second electrode substantially surrounding the first electrode, the first and the second electrodes being substantially coplanar and in a plane different from the reactance, the second electrode being connected to the reference potential.

46. A vacuum plasma processor comprising:
a vacuum plasma chamber for processing a workpiece, the chamber being associated with a reactance for electrical coupling with gas in the chamber, the chamber including an electrode assembly arranged for electrical coupling with gas in the chamber, the electrode assembly including a first electrode;
an AC electric source arrangement connected to said reactance, the AC source arrangement having sufficient power to excite the gas in the chamber to a plasma;
the chamber, the reactance and the electrode assembly being arranged for causing (a) plasma exciting AC electric fields at a frequency of the source arrangement to subsist between the reactance and electrode assembly and (b) a DC bias voltage to be developed on an electrode of the electrode assembly in response to the gas in the chamber being excited to a plasma;
a detector for the DC bias voltage; and
circuitry connected to be responsive to the detector for controlling the plasma exciting AC electric fields;
the circuitry including a variable impedance connected to an electrode of the electrode assembly, the variable impedance being arranged to have a value controlled in response to the detected DC bias voltage, the variable impedance being a reactance of a series tuned circuit.

47. The vacuum plasma processor of claim 46 wherein the variable impedance is connected between the first electrode and a reference potential.

48. The vacuum plasma processor of claim 46 wherein the variable impedance is included in a branch consisting of passive components.

49. The vacuum plasma processor of claim 48 wherein the electrode assembly includes a second electrode substantially surrounding the first electrode, the first and the second electrodes being substantially coplanar and in a plane different from the reactance, the second electrode being connected to the reference potential.

50. The vacuum plasma processor of claim 46 wherein the circuitry is connected between the first electrode and a reference potential, the electrode assembly including a second electrode substantially surrounding the first electrode, the first and the second electrodes being substantially coplanar and in a plane different from the reactance, the second electrode being connected to the reference potential.

51. The processor of claim 46 wherein the chamber and electrode assemblies are arranged for causing (a) plasma exciting AC electric field lines at frequencies of the source arrangement to subsist between the first and second electrode assemblies and (b) DC bias voltages to be developed on at least one of said electrodes in response to the gas in the chamber being excited to a plasma and the detector being included in a detector arrangement for the DC bias voltage; and circuitry for affecting the AC electric field lines based on indications of the detected DC bias voltage on at least one of the electrodes.

52. A vacuum plasma processor comprising:
a vacuum plasma chamber for processing a workpiece, the chamber including a first electrode assembly arranged to be electrically coupled with gas in the chamber and a second electrode assembly arranged to be electrically coupled with gas in the chamber, the first electrode assembly including a first electrode, the second electrode assembly including a second electrode;
an AC electric source arrangement including plural frequencies connected to at least one of said electrodes, the AC source arrangement having sufficient power to excite the gas in the chamber to a plasma;
the chamber and the electrode assemblies being arranged for causing (a) plasma exciting AC electric field lines at frequencies of the source arrangement to subsist between the first and second electrode assemblies and (b) DC bias voltages to be developed on at least one of said electrodes in response to the gas in the chamber being excited to a plasma;
a detector arrangement for the DC bias voltages; and
circuitry for affecting the AC electric field lines based on indications of the detected DC bias voltages on at least one of the electrodes.

53. The processor of claim 52 wherein the AC source arrangement and the first and second electrodes are arranged for causing first and second frequencies to be respectively coupled from the source arrangement to the first and second electrodes so that electric field lines at the first frequency extend between the first and second electrodes and electric field lines at the second frequency extend between the second and first electrodes, the circuitry including a first circuit connected between the first electrode and a reference potential and a second circuit connected between the second electrode and the reference potential, the first circuit including a first variable impedance for affecting the electric field lines at the second frequency based on the indication of the detected DC bias voltage of the second electrode, the second circuit including a second variable impedance for affecting the electric field lines at the first frequency based on the indication of the detected DC bias voltage of the first electrode.

54. The processor according to claim 52 wherein the second assembly includes a third electrode, the chamber and the electrode assemblies being arranged for causing (a) first electric field lines at a first of said AC frequencies to subsist between the first electrode and at least one of the second and third electrodes and (b) second electric field lines at a second of said AC frequencies to subsist between the second and third electrodes; the chamber, the electrode assemblies and the circuitry being arranged for causing the circuitry to affect the first and second electric field lines based on indications of the detected DC bias voltages.

55. The vacuum plasma processor of claim 54 wherein the first assembly includes a fourth electrode; the chamber and the electrode assemblies being arranged for causing third electric field lines at said first AC frequency of the source assembly to subsist between the first and fourth electrodes; the chamber, the electrode assemblies and the circuitry being arranged for causing the circuitry to affect the third electric field lines based on an indication of the second detected DC bias voltage.

56. The processor of claim 52 wherein the circuitry is connected to be responsive to at least one signal indicative of the detected DC bias voltages on at least one of the electrodes.

57. The processor of claim 56 wherein the circuitry is arranged for affecting the AC electric field lines associated with at least some of the frequencies.

58. The processor of claim 52 wherein the AC source arrangement and the first and second electrodes are arranged for causing first and second frequencies to be respectively coupled from the source arrangement to the first and second electrodes so that electric field lines at the first frequency extend between the first and second electrodes and electric field lines at the second frequency extend between the second and first electrodes, the circuitry including a first circuit connected between the first electrode and a reference potential and a second circuit connected between the second electrode and the reference potential, the first circuit including a first variable impedance for affecting the electric field lines at the second frequency in response to a signal indicative of detected DC bias voltage of the second electrode, the second circuit including a second variable impedance for affecting the electric field lines at the first frequency in response to the signal indicative of the detected DC bias voltage of the first electrode.

59. The processor according to claim 58 wherein the second assembly includes a third electrode, the chamber and the electrode assemblies being arranged for causing (a) first electric field lines at said first AC frequency to subsist between the first electrode and at least one of the second and third electrodes and (b) second electric field lines at said second AC frequency to subsist between the second and third electrodes; the chamber, the electrode assemblies and the circuitry being arranged for causing the circuitry to affect the first and second electric field lines in response to the DC signals indicative of the detected DC bias voltages.

60. The vacuum plasma processor of claim 59 wherein the second electrode is at least substantially surrounded by the third electrode.

61. The vacuum plasma processor of claim 60 wherein the second and third electrodes are substantially coplanar and are in a plane different from a plane in which the first electrode is located.

62. The vacuum plasma processor of claim 61 wherein the first, second and third electrodes are coaxial and have circular peripheries.

63. The vacuum plasma processor of claim 62 wherein the first assembly includes a fourth electrode at least substantially surrounding the first electrode; the fourth electrode being coaxial with the first, second and third electrodes and having a circular periphery and being substantially coplanar with the first electrode; the chamber and electrode assemblies being arranged for causing third electric field lines at the first frequency to subsist between the first and fourth electrodes; the chamber, electrode assemblies and the circuitry being arranged for causing the circuitry to affect the third electric field lines in response to the signal indicative of the detected second DC bias voltage.

* * * * *